US009601595B2

United States Patent
Yang et al.

(10) Patent No.: US 9,601,595 B2
(45) Date of Patent: Mar. 21, 2017

(54) HIGH BREAKDOWN VOLTAGE LDMOS DEVICE

(71) Applicants: Hongning Yang, Chandler, AZ (US); Daniel J. Blomberg, Chandler, AZ (US); Jiang-Kai Zuo, Chandler, AZ (US)

(72) Inventors: Hongning Yang, Chandler, AZ (US); Daniel J. Blomberg, Chandler, AZ (US); Jiang-Kai Zuo, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/968,343

(22) Filed: Dec. 14, 2015

(65) Prior Publication Data

US 2016/0099341 A1    Apr. 7, 2016

Related U.S. Application Data

(62) Division of application No. 13/537,619, filed on Jun. 29, 2012, now Pat. No. 9,231,083.

(51) Int. Cl.
*H01L 29/66* (2006.01)
*H01L 29/78* (2006.01)
(Continued)

(52) U.S. Cl.
CPC .. *H01L 29/66689* (2013.01); *H01L 21/76264* (2013.01); *H01L 29/1083* (2013.01);
(Continued)

(58) Field of Classification Search
CPC .................................................. H01L 29/1083
See application file for complete search history.

(56) References Cited

U.S. PATENT DOCUMENTS

| 5,994,189 A | 11/1999 | Akiyama |
| 6,439,514 B1 | 8/2002 | Yamaguch et al. |

(Continued)

FOREIGN PATENT DOCUMENTS

| JP | 05-136436 A | 6/1993 |
| JP | 2000-223665 A | 8/2000 |

(Continued)

OTHER PUBLICATIONS

Qiao, Ming, et al., "High-voltage Thick Layer SOI Technology for PDP Scan Driver IC", Proceedings of the 23rd International Symposium on Power Semiconductor Devices & IC's. May 23-26, 2011.

(Continued)

*Primary Examiner* — Caleb Henry
*Assistant Examiner* — Mounir Amer

(57) ABSTRACT

A multi-region (81, 83) lateral-diffused-metal-oxide-semiconductor (LDMOS) device (40) has a semiconductor-on-insulator (SOI) support structure (21) on or over which are formed a substantially symmetrical, laterally internal, first LDMOS region (81) and a substantially asymmetric, laterally edge-proximate, second LDMOS region (83). A deep trench isolation (DTI) wall (60) substantially laterally terminates the laterally edge-proximate second LDMOS region (83). Electric field enhancement and lower source-drain breakdown voltages (BVDSS) exhibited by the laterally edge-proximate second LDMOS region (83) associated with the DTI wall (60) are avoided by providing a doped SC buried layer region (86) in the SOI support structure (21) proximate the DTI wall (60), underlying a portion of the laterally edge-proximate second LDMOS region (83) and of opposite conductivity type than a drain region (31) of the laterally edge-proximate second LDMOS region (83).

15 Claims, 10 Drawing Sheets

(51) Int. Cl.
  *H01L 29/10*   (2006.01)
  *H01L 21/762*  (2006.01)
  *H01L 29/06*   (2006.01)

(52) U.S. Cl.
  CPC .. *H01L 29/66484* (2013.01); *H01L 29/66772* (2013.01); *H01L 29/7824* (2013.01); *H01L 29/0653* (2013.01)

(56) References Cited

U.S. PATENT DOCUMENTS

| | | |
|---|---|---|
| 7,074,681 B2 | 7/2006 | De Fresart et al. |
| 7,791,161 B2 | 9/2010 | Zhu et al. |
| 8,129,785 B2 | 3/2012 | Izum et al. |
| 2008/0191277 A1 | 8/2008 | Disney et al. |
| 2011/0012196 A1 | 1/2011 | Williams et al. |
| 2011/0140200 A1 | 6/2011 | Anderson et al. |
| 2011/0260245 A1 | 10/2011 | Liu et al. |

FOREIGN PATENT DOCUMENTS

| | | |
|---|---|---|
| JP | 2006-310770 A | 11/2006 |
| JP | 2007-158098 A | 6/2007 |
| JP | 2007201154 | 8/2007 |
| JP | 2009-88199 A | 4/2009 |

OTHER PUBLICATIONS

Khan, Tahir, et al., "Rugged Dotted-Channel LDMOS Structure", Freescale Semiconductor, Inc., Tempe, AZ.

Hower, P., et al., "A Rugged LDMOS for LBC5 Technology", Proceedings of the 17th International Symposium on Power Semiconductor Devices & IC's, May 23-26, 2005.

Extended European Search Report dated Jul. 6, 2016 in EP Application No. 13173277.8.

HIGH BREAKDOWN VOLTAGE LDMOS DEVICE

CROSS-REFERENCE TO RELATED APPLICATION

This application is a divisional of co-pending U.S. application Ser. No. 13/537,619, filed Jun. 29, 2012.

FIELD OF THE INVENTION

The present invention generally relates to semiconductor devices and circuits and methods for fabricating semiconductor devices and circuits, and more particularly relates to semiconductor devices and circuits embodying laterally-diffused-metal-oxide-semiconductor (LDMOS) devices.

BACKGROUND OF THE INVENTION

Insulated gate field effect transistors (IGFETs) are much used in modern electronics as individual devices and as part of various integrated circuits (ICs). Metal-oxide-semiconductor (MOS) devices are a well-known form of IGFETs and are commonly referred to by the abbreviation MOSFET. The abbreviations MOS and MOSFET and the terms for which they stand are commonly used in the art to refer to IGFETs irrespective of whether the conductive gate of such devices is metallic or of some other conductor, and irrespective of whether the gate insulator is of oxide or some other dielectric. Unless specifically noted otherwise, the abbreviations MOS, MOSFET and the terms for which they stand are to be interpreted to include any conductive material and not just metallic elements for the gate conductor and any dielectric material and not just oxides for the gate insulator.

Laterally-diffused-metal-oxide-semiconductor (LDMOS) devices are a well-known sub-set of MOSFETs that are much used, especially in connection with high voltage and/or high power applications. Various modifications have been made to LDMOS devices to improve their various properties, e.g., breakdown voltage, gain, leakage current, power handling capability, etc. Nevertheless, there is an ongoing need for further improvements. This is especially true in connection with the source-drain breakdown voltage (referred to as "BVDSS") of LDMOS devices. The various embodiments of the invention illustrated herein provide devices of improved properties.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
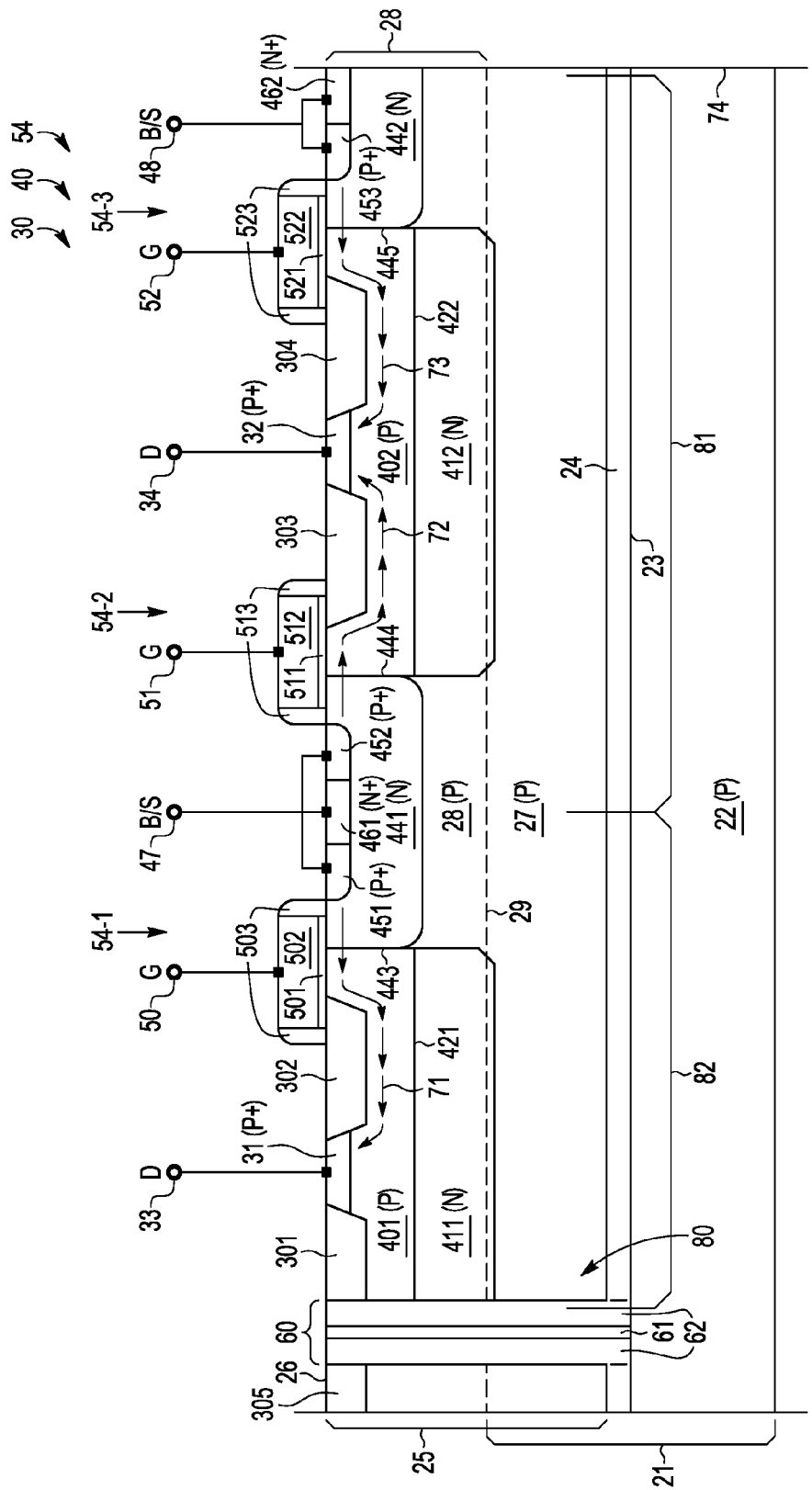
FIG. 1 shows a simplified cross-sectional view of a lateral-diffused-metal-oxide-semiconductor (LDMOS) device according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate", "semiconductor substrate" and "SC substrate" are intended to include single crystal structures, polycrystalline structures, amorphous structures, thin film structures, layered structures as for example and not intended to be limiting, semiconductor-on-insulator (SOI) structures or insulator on semiconductor (IOS) structures, and combinations thereof.

For convenience of explanation and not intended to be limiting, semiconductor (SC) devices and methods of fabrication are described herein for silicon semiconductors and silicon oxide insulators or dielectrics, but persons of skill in the art will understand that other semiconductor and/or insulating materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type is then either P or N type.

Various embodiments of the invention will be illustrated for P-channel LDMOS devices or elements thereof, but, again, this is merely for convenience of description and is not intended to be limiting. Persons of skill in the art will understand that N-channel LDMOS devices and related regions and other semiconductor devices and circuits embodying either or both N and P or P and N combinations may be provided by appropriate interchange of conductivity types in the various regions. For convenience of description, the convention is adopted in the various drawings of identifying the exemplary (e.g., P-channel) configuration by placing the corresponding conductivity type in parentheses following the associated reference number, but it will be understood that this is by way of illustration and not limitation.

For example, in FIGS. 1-10, body contacts 461, 462 are identified as 461(N+), 462(N+), source regions 451, 452, 453 are identified as 451(P+), 452(P+), 453(P+), well regions 401, 402, 441, 411, 412 and 442 are identified as 401(P), 402(P); 411(N), 412(N) and 441(N), 442(N), etc., to illustrate the exemplary conductivity types for a P-channel embodiment. It will be understood that this is by way of example and not limitation.

FIG. 1 shows a simplified cross-sectional view of lateral-diffused-metal-oxide-semiconductor (LDMOS) device 20 according to the prior art. LDMOS device 20 comprises substrate 22 having upper surface 23. Substrate 22 may be of any thermally stable material. For convenience of manufacture, substrate 22 is typically a (e.g., P type) semiconductor wafer but that is not essential. Overlying upper surface 23 is insulating (e.g., silicon oxide) layer 24, also referred to as buried-oxide (BOX) layer 24, although other materials besides oxides may be used for insulating layer 24 and the term BOX layer 24 is intended to include such variations. Overlying BOX layer 24 is semiconductor (SC) active device region or layer 25 having upper surface 26. The combination of SC active device region or layer 25 and BOX layer 24 is often referred to as a semiconductor-on-insulator (SOI) structure. Various doped and insulating regions have been formed in SC active device region or layer 25. Lower semiconductor (SC) portion 27 of SC active device region or layer 25 is conveniently a (e.g., P type) SC epi layer, but that is not essential. Overlying lower SC portion 27 is upper SC portion 28 of SC active device region or layer 25, extending to upper surface 26. The approximate location of interface 29 between lower SC portion 27 and upper SC portion 28 is indicated. Upper SC portion 28 is conveniently also a (e.g., P type) SC epi layer, but that is not essential.

Shallow trench isolation (STI) regions 301, 301, 303, 304, etc., (collectively 30) extend from upper surface 26 into upper SC portion 28. Lying between STI regions 301, 302 at surface 26 is (e.g., P+) drain region 31 with drain connection 33 and lying between STI regions 303, 304 at surface 26 is (e.g., P+) drain region 32 with drain connection 34. Underlying STI regions 301, 302 and drain region 31 is (e.g., P type) well region 401 and underlying STI regions 303, 304 and drain region 32 is (e.g., P type) well region 402. Well regions 401, 402 (collectively 40) are also referred to as drift spaces 401, 402 (collectively drift spaces 40). Underlying (e.g., P type) well regions 401, 402 (collectively 40) are (e.g., N type) well regions 411, 412 (collectively 41), respectively. PN (or NP) junction 421 lies between well regions 401 and 411, and PN (or NP) junction 422 lies between well regions 402 and 412. Lying laterally between wells regions 401, 402 is (e.g., N type) well region 441 and lying laterally to the right of well region 402 is (e.g., N type) well region 442. Well regions 441, 442 are referred to collectively as well regions 44, which can function as the channel bearing body regions for the LDMOS device Well regions 44 extend substantially to upper surface 26 of SC active device region or layer 25.

Lying laterally within (e.g., N type) well region 441 are (e.g., P+) source regions 451, 452 and (e.g., N+) body contact region 461 extending to surface 26. Source region 451 is laterally spaced apart from NP or PN junction 443 between (e.g., N type) well region 441 and (e.g., P type) drift space 401. Source region 452 is laterally spaced apart from NP or PN junction 444 between (e.g., N type) well region 441 and (e.g., P type) drift space 402. Source region 453 is laterally spaced apart from NP or PN junction 445 between (e.g., N type) well region 442 and (e.g., P type) drift space 402. Body contact (e.g., N+) region 461 is provided to (e.g., N type) well region 441 and body contact (e.g., N+) region 462 is provided to (e.g., N type) well region 442. Body/Source (B/S) connection 47 is conveniently but not essentially provided to both source regions 451, 452 and body contact region 461, and B/S connection 48 is conveniently but not essentially provided to both source region 453 and body contact region 462. While it is convenient to have B/S connections 47, 48 coupled to both associated source regions and body contact regions, this is not essential and body contact and source connections may be made separately in other embodiments.

Overlying surface 26 between (e.g., P+) source region 451 and (e.g., P type) drift space 401 is gate insulator 501 with overlying gate conductor 502 and gate connection 50. Overlying surface 26 between source region 452 and drift space 402 is gate insulator 511 with overlying gate conductor 512 and gate connection 51. Overlying surface 26 between source region 453 and drift space 402 is gate insulator 521 with overlying gate conductor 522 and gate connection 52. It is convenient but not essential that gate conductor 502 also extends laterally partially over STI region 302, that gate conductor 512 also extends laterally partially over STI region 303, and that gate conductor 522 also extends laterally partially over STI region 304. STI region 301 and well regions 401 and 411 are terminated at their left edges by deep trench isolation (DTI) region 60 extending substantially from surface 26 to substrate 22. DTI region 60 conveniently but not essentially has poly-SC core 61 and surrounding dielectric regions 62, but other DTI region configurations may be used in other embodiments. STI region 305 may extend leftward laterally beyond DTI region 60 but that is not essential.

In a typical arrangement of LDMOS device 20, gate (G) connections 50, 51, 52 are coupled together in parallel, drain (D) connections 33, 34 are coupled together in parallel and B/S connections 47, 48 are coupled together in parallel. When such connections are appropriately biased, source-drain (SD) current 71 flows between source region 451 and drain region 31, SD current 72 flows between source region 452 and drain region 32, and SD current 73 flows between source region 453 and drain region 32, and so forth for analogous device regions and connections that may be present to the right of boundary 74 of LDMOS device 20 of FIG. 1. A difficulty with devices of the type illustrated in FIG. 1 is that BVDSS is sometimes less than desired.

It has been found that different portions of device 20 exhibit different values for BVDSS, with the overall BVDSS being determined by the weakest portion of the device rather than the device as a whole. It has further been discovered that the weakest portion of device 20 in terms of BVDSS is associated with region 80 adjacent DTI region 60. It will be noted that device 20 may be divided into two topologically distinct regions: (A) symmetrical region 81 to the right in FIG. 1 where, for example, drain region 32 has SD currents 72, 73 arriving from symmetrically arranged source regions 452, 453; and (B) asymmetric region 82 to the left in FIG.

1 where, for example, drain region 31 has SD current 71 arriving from source region 451 to the right of drain region 31, but no SD current is arriving from the left of drain regions 31 since asymmetric region 82 is terminated on the left by DTI region 60. Stated another way, symmetrical LDMOS region 81 operates the same in either lateral leftward or rightward direction, while asymmetrical region 82 does not exhibit such symmetry and is operationally different in the lateral leftward and rightward directions. It has been found that such operational asymmetry results in $BVDSS_{82}$ for the LDMOS device of asymmetric region 82 being significantly less than $BVDSS_{81}$ for the LDMOS device of symmetrical region 81; for example, $BVDSS_{82} \sim 126.9$ volts compared to $BVDSS_{81} \sim 146.3$ volts. This is a significant difference. Under these circumstances, $BVDSS_{20}$ of LDMOS device 20 of FIG. 1 is determined by, e.g., $BVDSS_{82}$ of the most vulnerable part of LDMOS 20. In other words, $BVDSS_{82}$ dominates $BVDSS_{20}$ of LDMOS device 20. This is not desirable.

Figure 2:
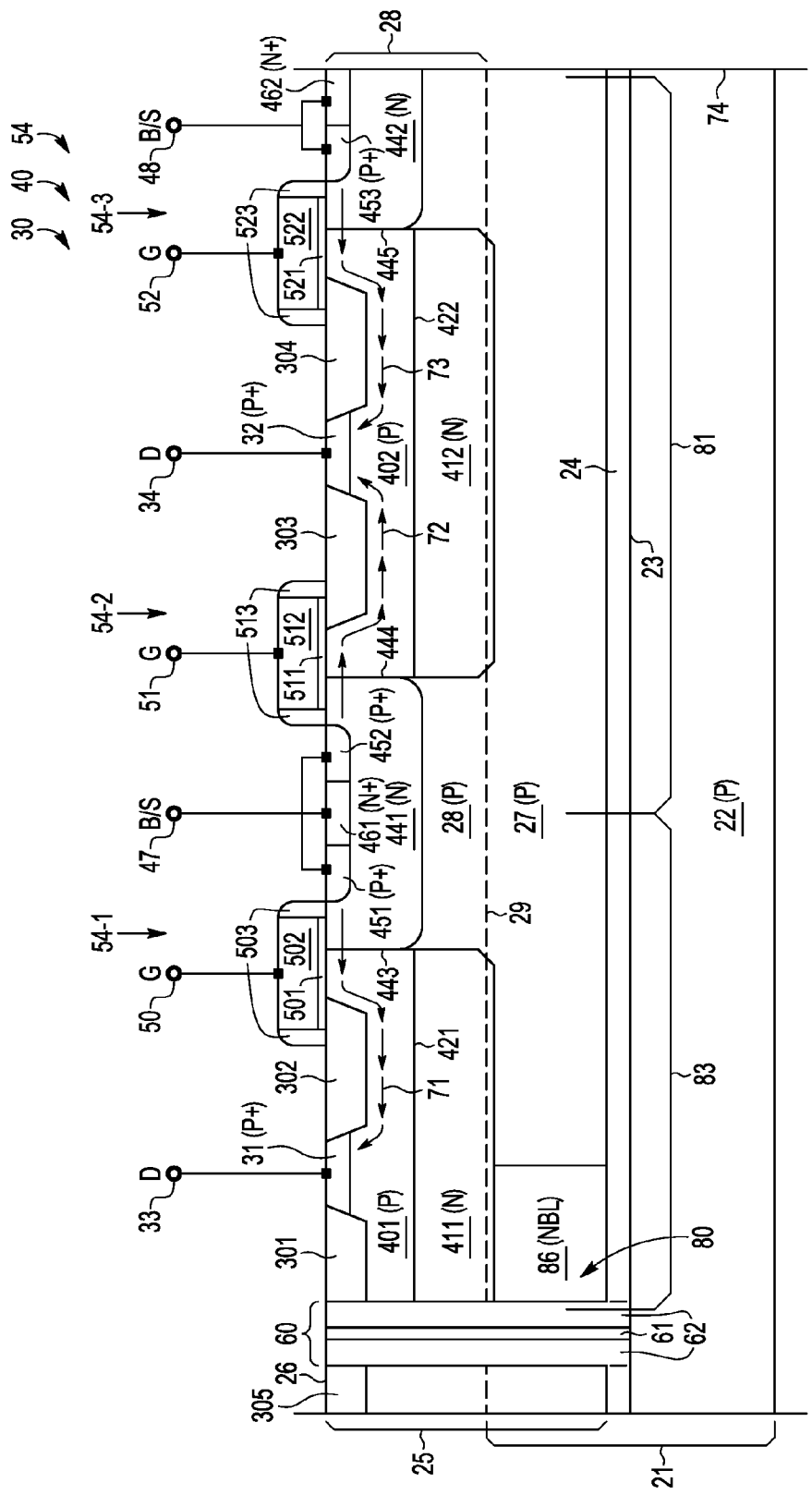
FIG. 2 shows a simplified cross-sectional view of an LDMOS device according to an embodiment of the invention.

FIG. 2 shows a simplified cross-sectional view of LDMOS semiconductor device 40 according to an embodiment of the invention, and in which the lower values of $BVDSS_{82}$ associated with asymmetric region 82 of FIG. 1 are avoided. For convenience and economy of description, the same reference numbers are used for analogous regions of LDMOS device 40 of FIG. 2 as for LDMOS device 20 of FIG. 1, and the discussion thereof in connection with FIG. 1 is incorporated herein by reference. This is not intended to imply that the present invention only applies to LDMOS devices 40 that are of the same general design as LDMOS device 20 of FIG. 1, but merely to illustrate that even when generally similar in design, the low values of $BVDSS_{82}$ and $BVDSS_{20}$ of LDMOS 20 are overcome by the present invention. The inventive principles illustrated in the various embodiments of LDMOS 40 described herein apply to a wide variety of LDMOS device structures and are not intended to be limited merely to those closely resembling prior art device 20 of FIG. 1. Further, the various doping levels and dimensions described in connection with FIGS. 3-10 concerning the manufacture of LDMOS 40 should not be presumed to refer to prior art LDMOS device 20 or to necessarily describe prior art choices of such doping levels and/or dimensions.

LDMOS device 40 of FIG. 2 differs from LDMOS device 20 of FIG. 1 by the inclusion of (e.g., N type) buried layer (BL) region 86 located in region 80 proximate DTI region 60. It has been found that this simple change raises the breakdown voltage $BVDSS_{83}$ of asymmetric region 83 of LDMOS 40 of FIG. 2 to be comparable to $BVDSS_{81}$ of symmetric region 81 of FIGS. 1 and 2. For example, other things being substantially equal, it is found that for LDMOS devices having $BVDSS_{81} \sim 146.3$ volts, then $BVDSS_{83} \sim 146.7$ volts so that $BVDSS_{40} \sim 146.3$ volts for LDMOS 40 of FIG. 2, compared to $BVDSS_{20} \sim 129.6$ volts for LDMOS 20 of FIG. 1 described above. This is a very significant improvement and is achieved with minimum alteration of the design and manufacture of LDMOS 40 of FIG. 2 compared to LDMOS device 20 of FIG. 1. This is explained more fully in connection with FIGS. 3-11.

FIGS. 3-10 show simplified cross-sectional views of the LDMOS device 40 of FIG. 2 during various stages 803-810 of manufacture wherein resulting structures 903-910 are illustrated, according to further embodiments of the invention. To facilitate appreciation of how the various regions and elements being formed in manufacturing stages 803-810 of FIGS. 3-10 relate to finished LDMOS device 40 of FIG. 2, brackets 81 and 83 of FIG. 2 are included in FIGS. 3-10.

As has previously been explained, bracket 81 identifies symmetrical LDMOS device portion 81 and bracket 83 identifies asymmetrical LDMOS device portion 83.

Figure 3:
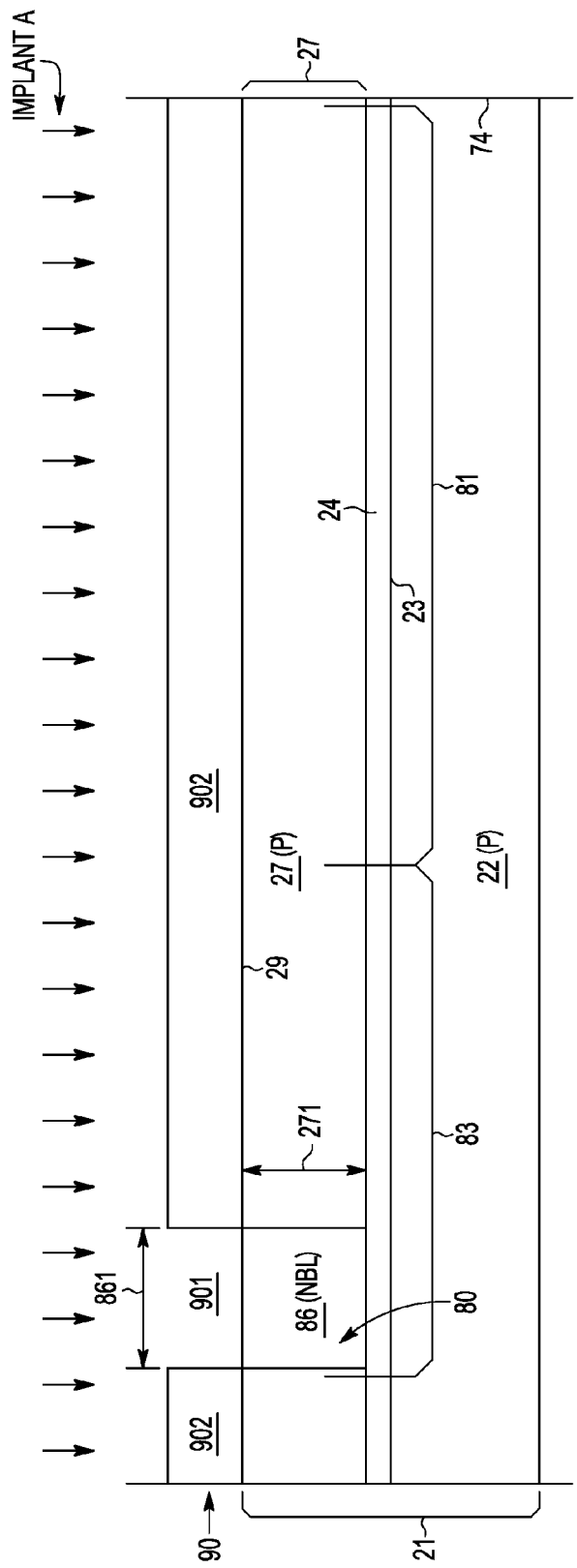
FIGS. 3-10 show simplified cross-sectional views of the LDMOS device of FIG. 2 during various stages of manufacture according to further embodiments of the invention.

Referring now to manufacturing stage 803 of FIG. 3, "handle wafer" or substrate 22 is provided having insulating BOX layer 24 on upper surface 23 of substrate 22. Overlying BOX layer 24 is semiconductor (SC) layer 27 of thickness 271. Thickness 271 is conveniently in the range of about 0.3 to 10 micrometers, although thicker or thinner layers may also be used. Layer 27 is also referred to as SC portion 27 as additional layers are provided as manufacturing progresses. SC layer or portion 27 (e.g., P type) is preferably formed by epitaxial growth, but other fabrication techniques can also be used. SC Layer or portion 27 conveniently has doping in the range of about 1.0E14 to 5.0E16 $cm^{-3}$ but higher or lower doping may also be used. Combination 21 of substrate 22, insulating layer 24 and SC layer or portion 27 may also be referred to as semiconductor-on-insulator (SOI) structure 21. Techniques for providing such SOI structures are well known in the art. Mask 90 is provided on upper surface 29 of SOI structure 21. Mask 29 has open region 901 and closed regions 902. Photoresist is convenient for mask 90, but other hard and/or soft mask materials may also be used. Implant (A) of, for example, phosphorus is provided through open region 901 of mask 90 to form (e.g., N type) buried layer (BL) region 86, but other dopants can also be used. It is desirable but not essential that BL region 86 extend substantially through SC layer or portion 27 to insulating layer 24, but other depths may also be used. BL region 86 is located laterally to include region 80 proximate the subsequent location of DTI region 60 of FIG. 2. It is desirable that the doping of BL region 86 be about in the range of about 1.0E13 to 5.0E15 $cm^{-3}$ but higher or lower doping concentrations may also be used. Lateral width of BL region 86 is conveniently in the range of about 0.7 to 5.0 micrometers, but greater or smaller widths may also be used. Structure 903 results.

Figure 4:
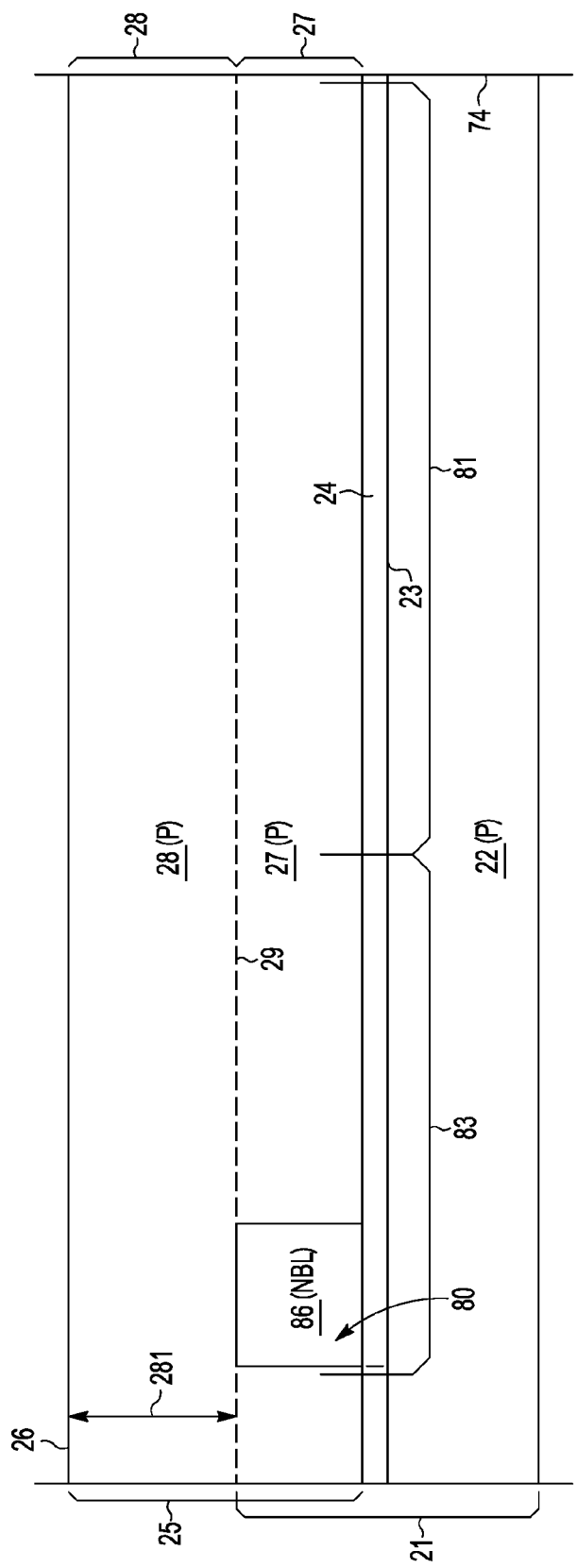

Referring now to manufacturing stage 804 of FIG. 4, mask 90 is removed and SC layer or portion 28 (e.g., P type) having upper surface 26 is provided over upper surface 29 of SC layer or portion 27. Thickness 281 is conveniently in the range of about 0.5 to 20.0 micrometers, although thicker or thinner layers may also be used. Layer 28 is also referred to as SC portion 28 as additional elements are provided as manufacturing progresses. SC layer or portion 28 (e.g., P type) is preferably formed by epitaxial growth, but other fabrication techniques can also be used. SC Layer or portion 28 conveniently has doping in the range of about 1.0E14 to 5.0E16 cm-3 but higher or lower doping may also be used. Structure 904 results.

Figure 5:
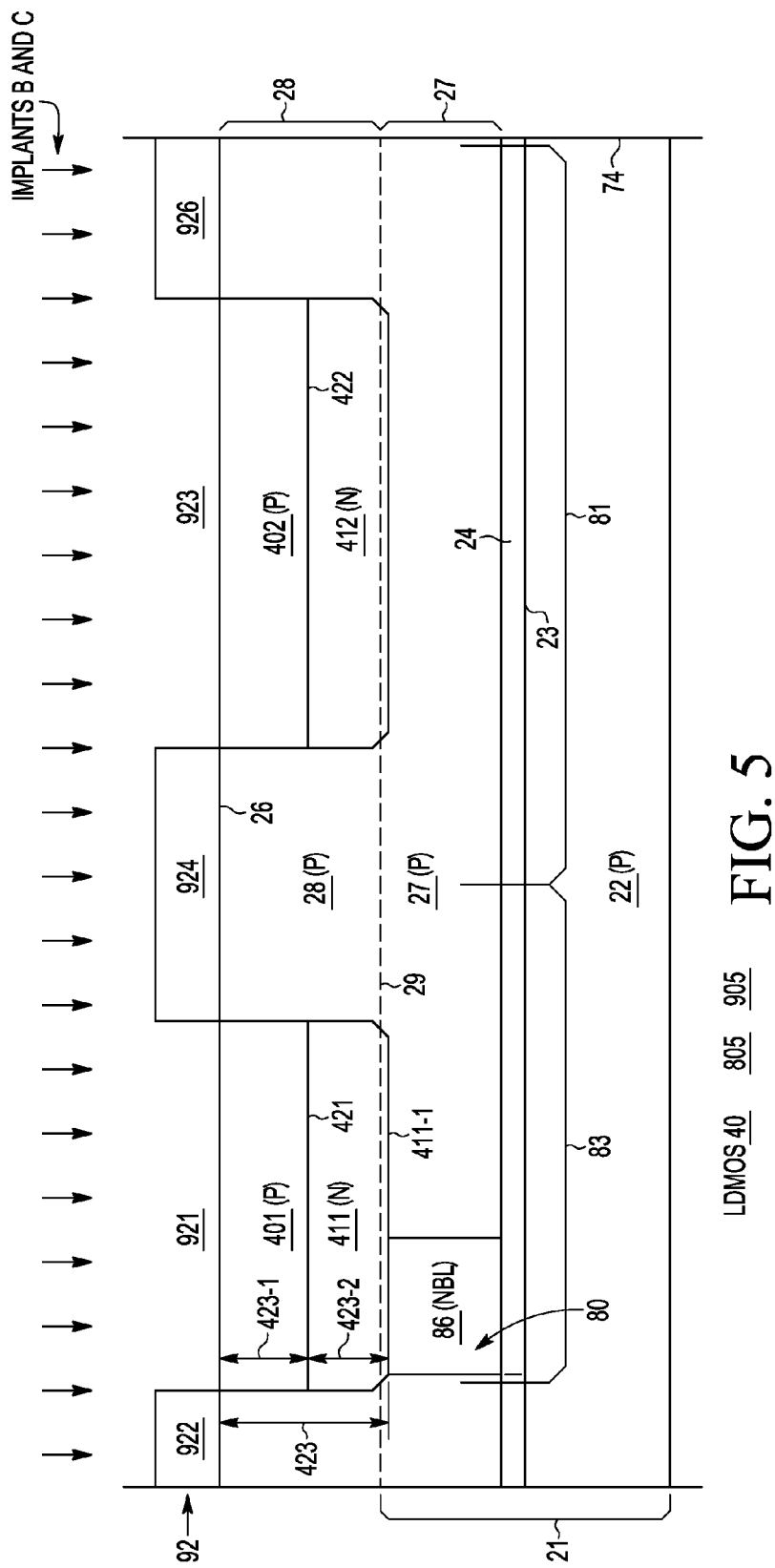

Referring now to manufacturing stage 805 of FIG. 5, mask 92 is applied over surface 26. Mask 92 has opening portions 921, 923 and closed portions 922, 924, 926. Implant B (e.g., of boron) and Implant C (e.g., of phosphorus) are both applied through open portions 921, 923 of mask 92. Implant B may be N or P type and Implant C may be then P or N type and may be applied in either order to form (e.g., P type) well regions 401, 402 proximate surface 26 and to form underlying (e.g., N type) well regions 411, 412 extending conveniently about to interface 29 between SC portions 27, 28. Well regions 401, 402 have thickness 423-1 conveniently in the range of about 0.5 to 4.0 micrometers and well regions 411, 412 have thickness 423-2 conveniently in the range of about 0.5 to 4.0 micrometers and the combination has thickness 423 conveniently in the range of about 1.0 to 9.0 micrometers, generally similar to thickness 281 of SC layer or portion 28 but larger or smaller thicknesses or depths may also be used. It is desirable but not essential that lower edge 411-1 of well region 411 extend to about BL region 86. Well regions 401, 402 (e.g., P type) conveniently have doping in the range of about 1.0E15 to 1.0E17 cm$^{-3}$ but higher or lower doping may also be used. Well regions 411, 412 (e.g., N type) conveniently have doping in the range of about 1.0E15 to 1.0E17 cm$^{-3}$ but higher or lower doping may also be used. Well regions 401, 411 fall generally within asymmetric LDMOS portion 83 and well regions 402, 412 fall generally within symmetric LDMOS portion 81. Well regions 401 and 402 normally serve as the drift space for (e.g., P-type) LDMOS device 40 while well regions 411 and 412 serve as reduced-surface-field (RESURF) regions. Structure 905 results.

Figure 6:
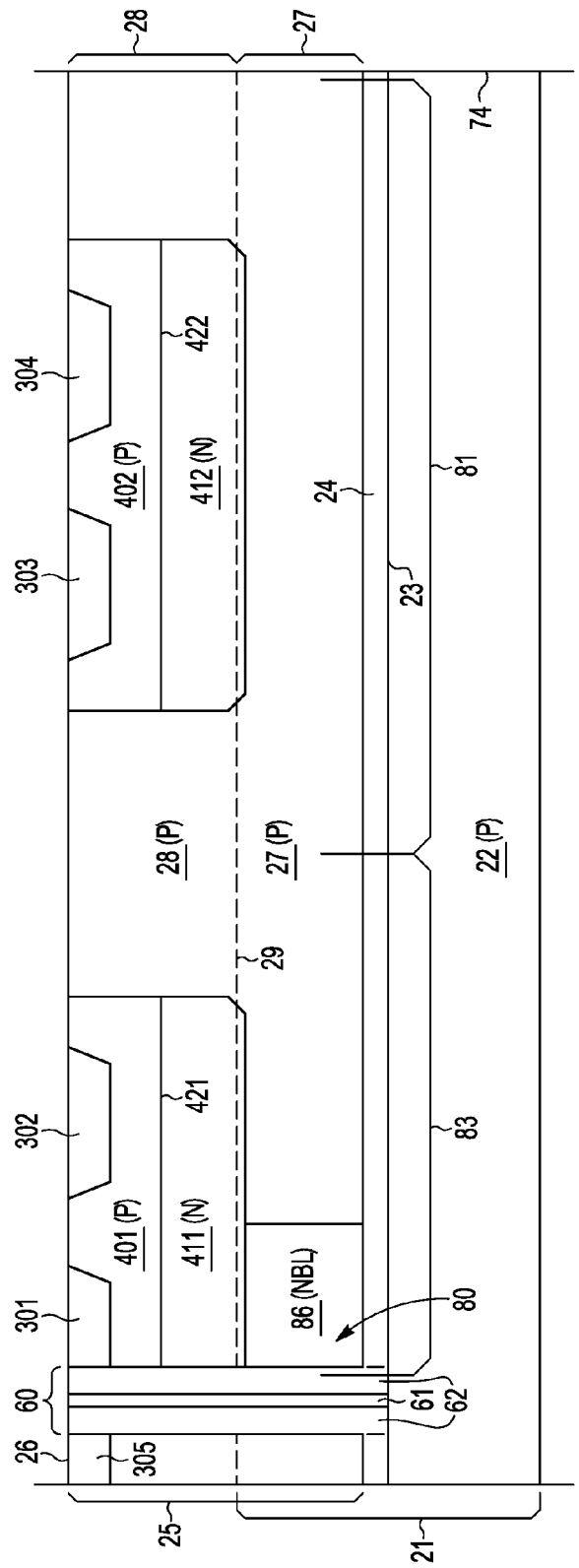

Referring now to manufacturing stage 806 of FIG. 6, mask 92 is removed and STI regions 301, 302, 303, 304 (and optionally 305) and DTI region 60 are formed extending into SC active device region or layer 25 from surface 26. STI regions 301, 302 are formed in well region 401 and STI regions 303, 304 are formed in well region 402. DTI region 60 is formed substantially at or intersecting the leftward part of well regions 401, 411 and BL 86, extending to substrate 22. Techniques for forming such STI and DTI regions are well known in the art. Structure 906 results.

Figure 7:
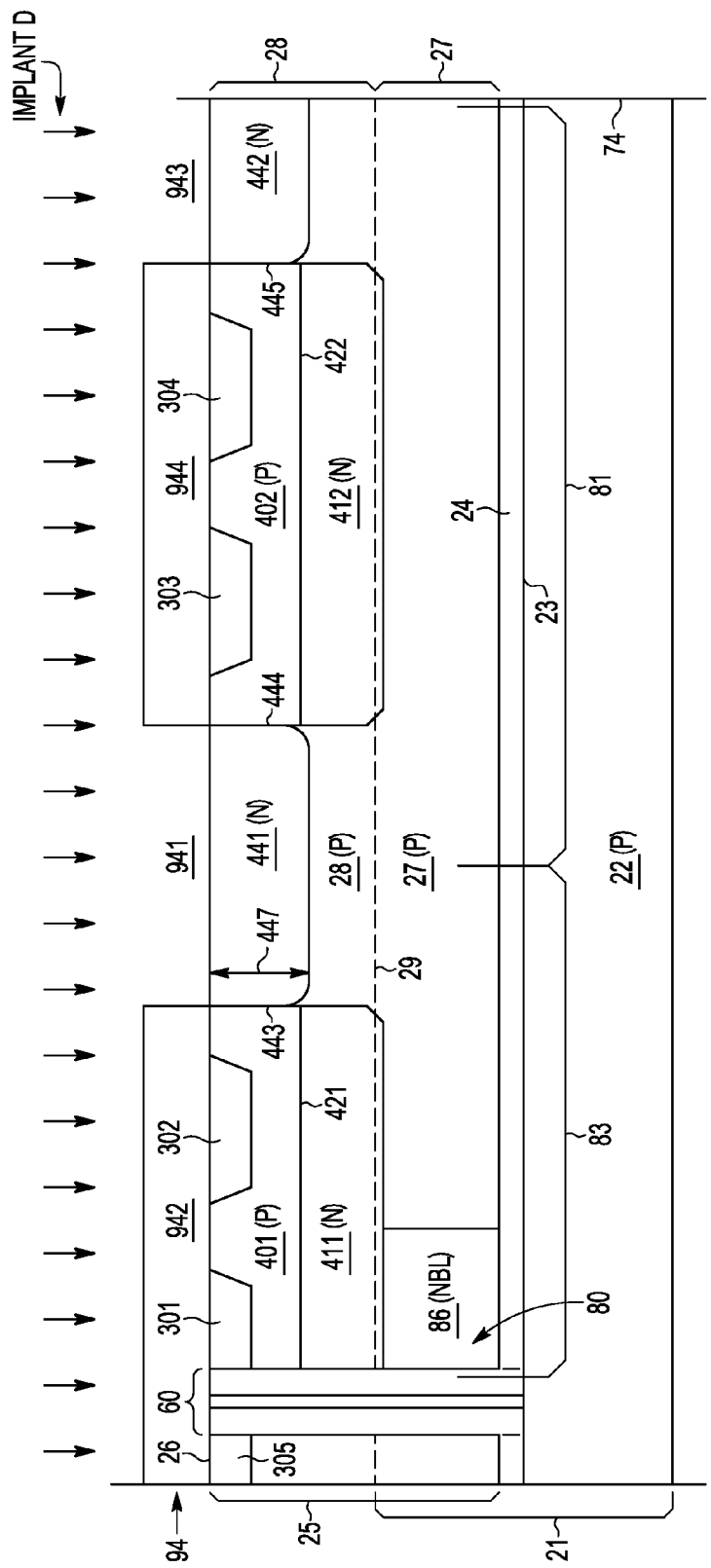

Referring now to manufacturing stage 807 of FIG. 7, mask 94 is provided over upper surface 26. Mask 94 has open portions 941, 943 and closed portions 942, 944. Implant D is provided through opening portions 941, 943 to from (e.g., N type) well regions 441, 442 under open regions 941, 943, respectively. Phosphorous is a non-limiting example of a suitable N type dopant, but other dopants may also be used. Well region 441 (e.g., N type) is located substantially between (e.g., P type) well regions 401, 402. Well region 442 (e.g., N type) is located to the right of (e.g., P type) well region 402, extending substantially to boundary or symmetry line 74. Well regions 441, 442 (e.g., N type) conveniently have doping in the range of about 5.0E16 to 5.0E17 cm$^{-3}$ but higher or lower doping may also be used. Well regions 441, 442 have depth 447 from surface 26 conveniently in the range of about 1.0 to 5.0 micrometers, although thicker or thinner layers may also be used. PN or NP junction 443 is formed between well regions 401 and 441, junction 444 is formed between well regions 441 and 402 and junction 445 is formed between well regions 402 and 442. Well regions 441 and 442 normally serve as the channel bearing body region of LDMOS device 40. Structure 907 results.

Figure 8:
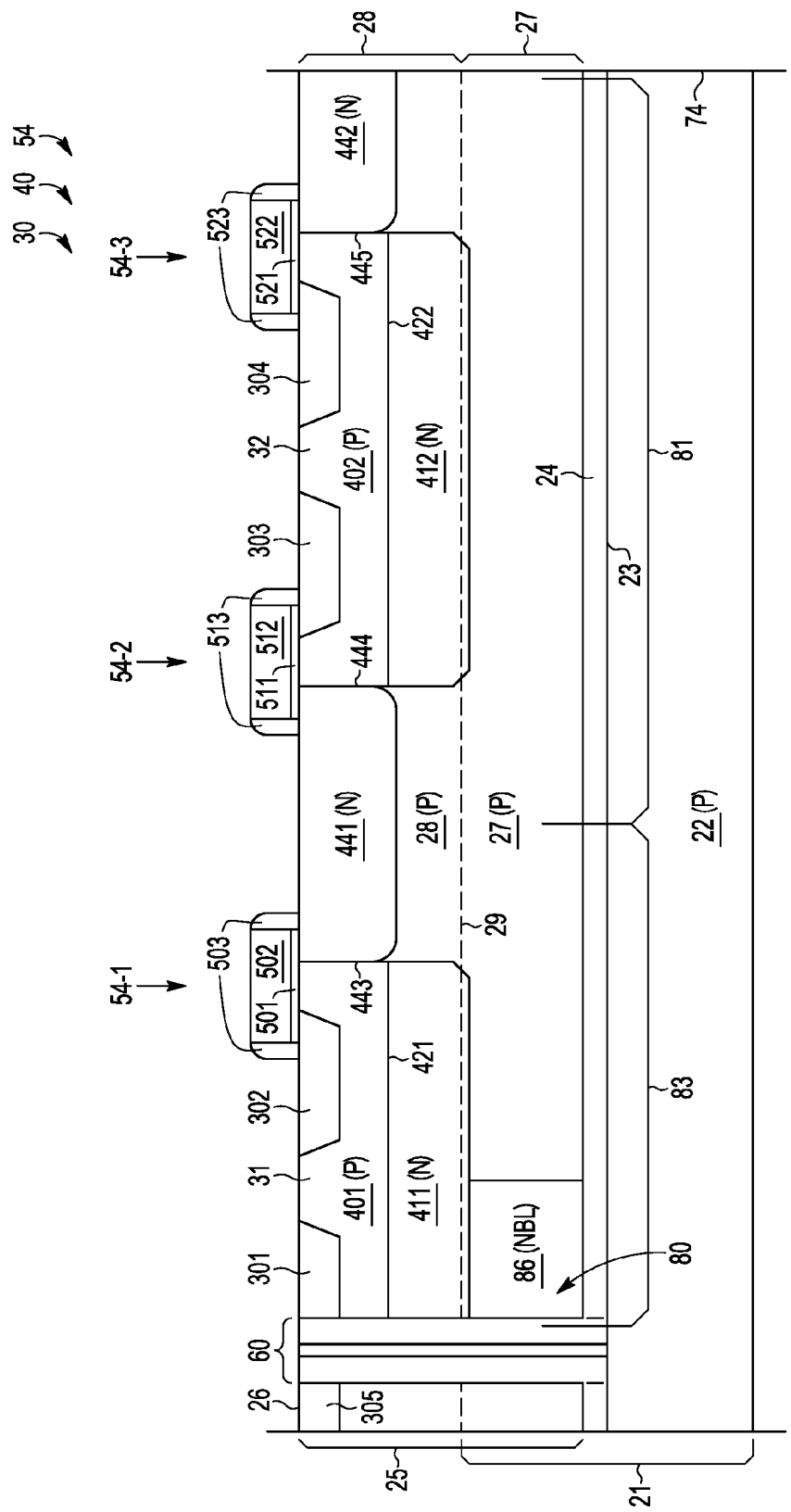

Referring now to manufacturing stage 808 of FIG. 8, mask 94 is removed and gate structures 54-1, 54-2, 54-3 (collectively 54) are provided. First gate structure 54-1 comprises gate insulator 501, gate conductor 502 and lateral gate dielectric spacers 503. Second gate structure 54-2 comprises gate insulator 511, gate conductor 512 and lateral gate dielectric spacers 513. Third gate structure 54-3 comprises gate insulator 521, gate conductor 522 and lateral gate dielectric spacers 523. Gate structures 54 are conventional and formation techniques therefore are well known in the art. First gate structure 54-1 straddles PN or NP junction 443, second gate structure 54-2 straddles PN or NP junction 444 and third gate structure 54-3 straddles PN or NP junction 445. Structure 908 results.

Figure 9:
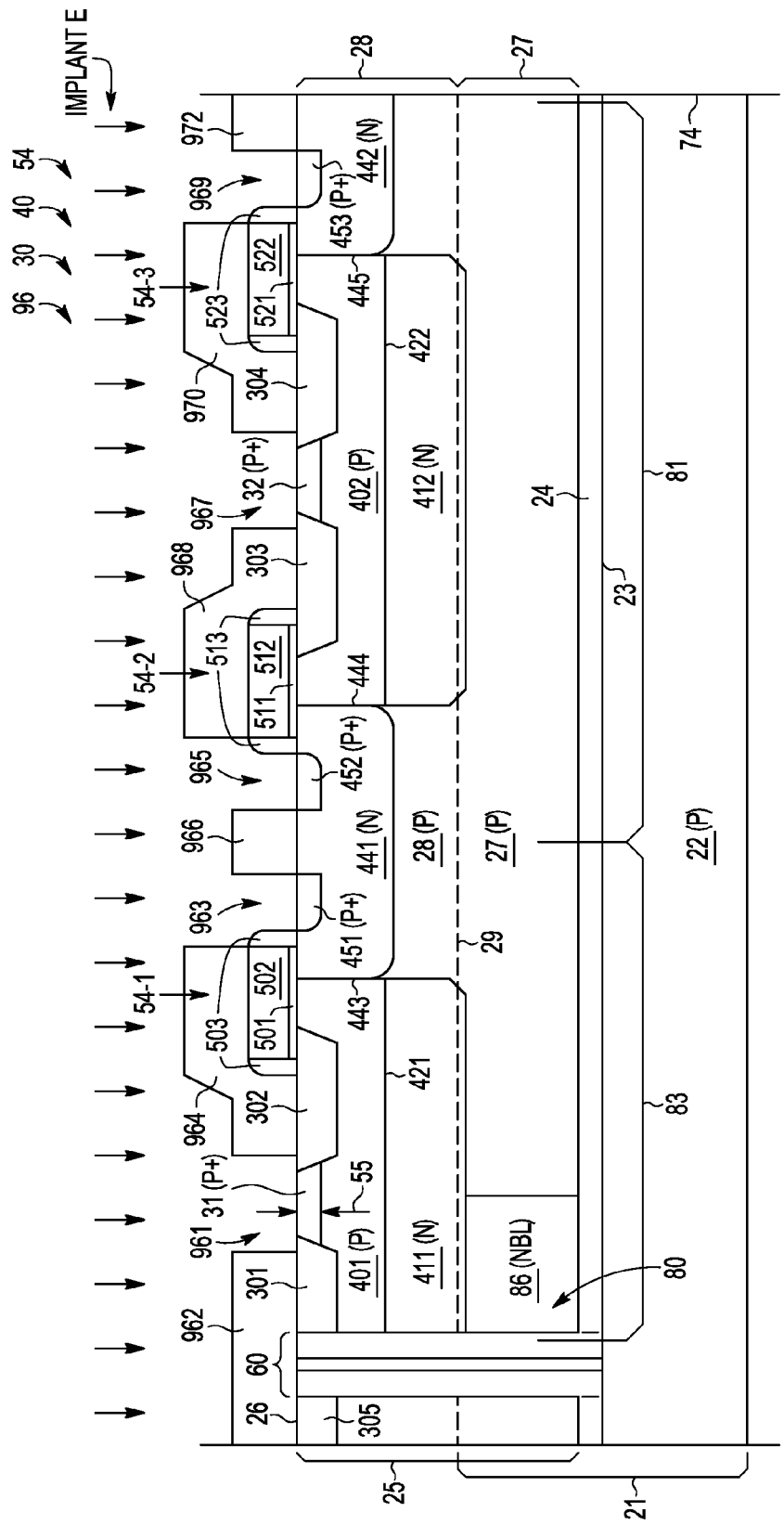

Referring now to manufacturing stage 809 of FIG. 9, mask 96 is applied having open portions 961, 963, 965, 967, 969 and closed portions 962, 964, 966, 968, 970, 972. Implant E (e.g., P type) is applied through open portions 961, 963, 965, 967, 969 to form, respectively, (e.g., all P+) drain region 31, source region 451, source region 452, drain region 32, and source region 453. Boron is a non-limiting example of a suitable P type dopant, but other dopants may also be used. Such source and drain regions have (e.g., P+) doping conveniently in the range of about 1.0E20 to 5.0E21 cm$^{-3}$ and comparatively shallow depth 55 conveniently in the range of about 0.1 to 0.25 micrometers, although higher or lower doping and larger or smaller depths may also be used. Structure 909 results.

Figure 10:
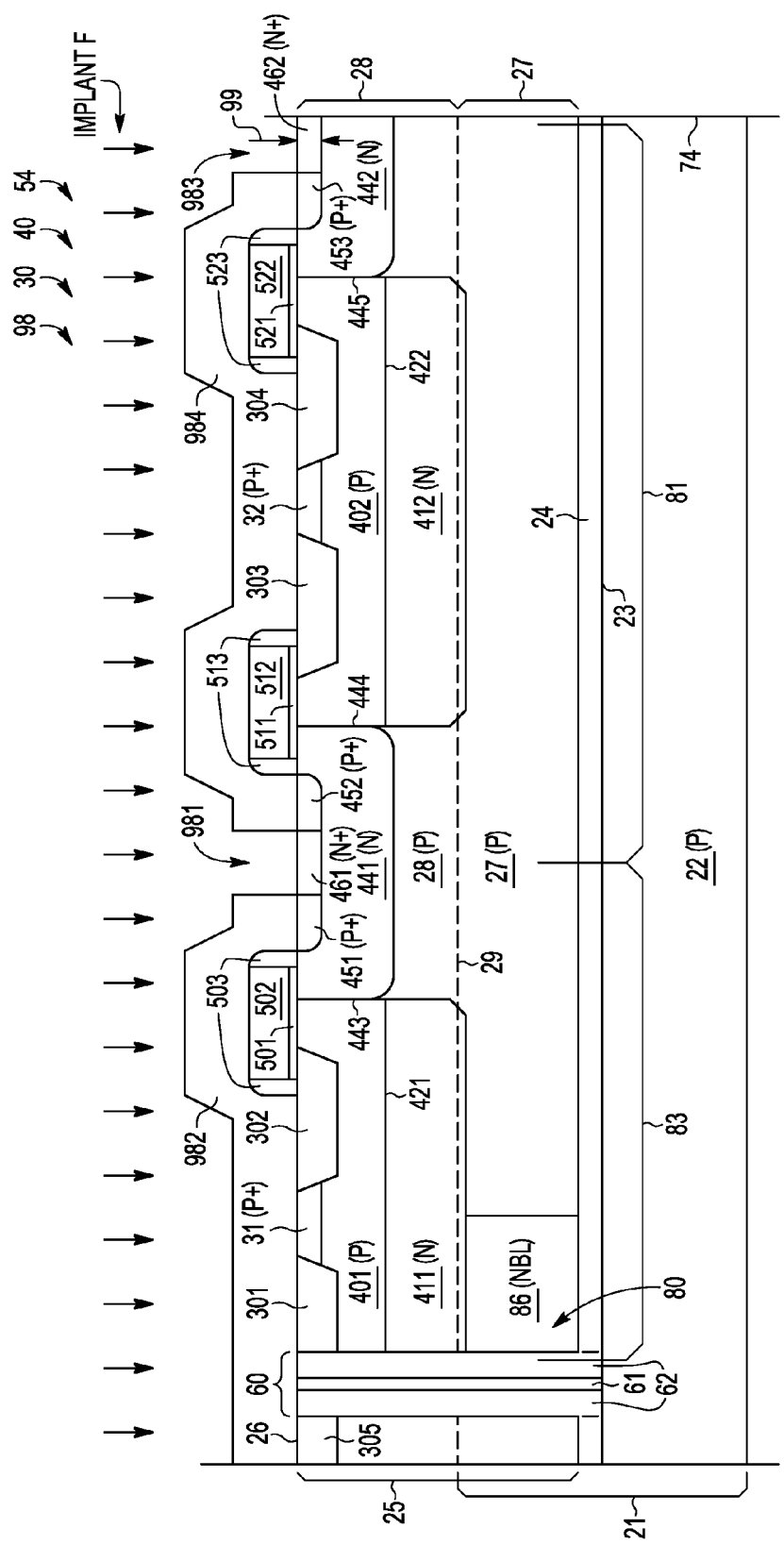

Referring now to manufacturing stage 810 of FIG. 10, mask 96 is removed and mask 98 applied. Mask 98 has open portions 981, 983 and closed portions 982, 984. Implant F is applied through open portions 981, 983 to form, respectively, (e.g., all N+) body contact regions 461, 462. Phosphorus is a non-limiting example of a suitable dopant but other dopant materials may also be used. Such body contact regions have (e.g., N+) doping conveniently in the range of about 1.0E20 to 5.0E21 cm$^{-3}$ and comparatively shallow depth 99 conveniently in the range of about 0.1 to 0.25 micrometers, although higher or lower doping and larger or smaller depths may also be used. Structure 910 results. Other than providing connections 33, 50, 47, 51, 34, 52, 48 illustrated in FIG. 2, LDMOS device 40 is substantially finished. Connections 33, 50, 47, 51, 34, 52, 48 are conventional, provided for example and not intended to be limiting, by forming a metal-semiconductor alloy (e.g., a silicide) on exposed SC drain region 31, source region 451, source region 452, drain region 32, and source region 453 and exposed SC body contact regions 461, 462. Additional passivation layers, conductor layers and interlayer dielectrics (not shown) may be provided over surface 26 to form any desired connections with other regions within LDMOS device 40 and/or with other devices on the same substrate and/or with external package connections, in the conventional manner.

According to a first embodiment, there is provided a multi-gate (53) lateral-diffused-metal-oxide-semiconductor (LDMOS) device (40) comprising, a semiconductor-on-insulator (SOI) support structure (21) on or over which are located at least one substantially symmetrical internal LDMOS region (81) and at least one asymmetric edge-proximate LDMOS region (83), a deep trench isolation (DTI) wall extending into the support structure (21) and substantially terminating the at least one edge-proximate LDMOS region (83), a drain region (31) of a first conductivity type proximate an upper surface (26) of the at least one asymmetric edge-proximate LDMOS regions (83), and a doped SC buried layer (BL) region (86) proximate the DTI wall (60), underlying a portion of the at least one asymmetric edge-proximate LDMOS region (83), and of opposite conductivity type than the drain region (31) of the at least one asymmetric edge-proximate LDMOS region (83). According to a further embodiment, the at least one asymmetric edge-proximate LDMOS region (83) comprises, a first well region and drift space (401) of the first conductivity type proximate and underlying the drain region (31), a second well region (411) of a second, opposite conductivity type, underlying the first well region and drift space (401), and wherein the BL region (86) is of the second conductivity type and underlies the second well region (411) proximate the DTI wall (60). According to a still further embodiment, the at least one substantially symmetrical internal LDMOS region (81) comprises, at least one drain region (32) substantially centrally located between a first laterally leftward located source region (452) and a second laterally rightward located source region (453), the first source region (452) located in a first body region (441) and the second source region (453) located in a second body region (442) separated from the first body region (441), a first gate structure (54-2) extending over at least a first part of the first body region (441) between the first source region (452) and the at least one drain region (32), and a second gate structure (54-3) extending over at least a second part of the second body region (442) between the second source region (453) and the at least one drain region (32). According to a yet further embodiment, the support structure comprises a substrate (22) on which is an insulating layer (24) over which is a first SC layer (27) and further comprising a second SC layer (28) overlying the first SC layer (27) and having the upper surface (26). According to a still yet further embodiment, the at least one substantially symmetrical internal LDMOS region (81) and the at least one asymmetric edge-proximate LDMOS region (83) are substantially located in the second SC layer (28). According to a yet still further embodiment, the BL region (86) substantially penetrates through the first and second SC layers to the insulating layer (24). According to another embodiment, the DTI wall penetrates substantially from the upper surface (26) to or through the insulating layer (24). According to a still another embodiment, the support structure comprises a substrate (22) on which is an insulating layer (24) over which is a first SC layer (27) and further comprising a second SC layer (28) overlying the first SC layer (27) and in which the first (401) and second (411) well regions are substantially located, and wherein the BL region (86) extends substantially from the second well region (411) to the insulating layer (24). According to a yet another embodiment, the at least one substantially symmetrical internal LDMOS region (81) has a first drain region (32) fed by at least two source regions (452, 453) located on laterally opposite sides of the first drain region (32) and the at least one asymmetric edge-proximate LDMOS region (83) has a least one second drain region (31) fed by at least one source region (451) located laterally only on one side of the second drain region (31).

According to a second embodiment, there is provided an LDMOS device (40), comprising, at least one centrally located LDMOS device region (81) having a first source region (453), a second source region (452) and a drain region (34) laterally located between the first source region (453) and the second source region (452), at least one peripherally located device region (83) having a peripherally located source region (451) and a peripherally located drain region (31) laterally outboard of the peripherally located source region (451), a deep trench isolation (DTI) region (60) laterally outboard of the at least one peripherally located device region (83), and a buried layer semiconductor region (86) underlying at least a portion of the at least one peripherally located device region (83), proximate the DTI region (60), and of opposite conductivity type than the peripherally located drain region (31). According to a further embodiment, the buried layer semiconductor region (86) is vertically separated from the peripherally located drain region (31) by a first well region (401) of the same conductivity type as the peripherally located drain region (31) and by a second well region (411) underlying the first well region (401) and of an opposite conductivity type as the peripherally located drain region (31). According to a still further embodiment, the buried layer semiconductor region (68) is laterally outboard of the peripherally located drain region (31). According to a yet further embodiment, the buried layer semiconductor region (68) is of opposite conductivity type than a semiconductor region substantially through which it passes. According to a still yet further embodiment, the buried layer semiconductor region (68) has a doping concentration in the range of about 1E13 to 5E15 $cm^{-3}$.

According to a third embodiment, there is provided a method for forming an LDMOS device (40) having at least one centrally located LDMOS region (81) and at least one peripherally located LDMOS region (83), comprising, providing a semiconductor-on-insulator (SOI) structure (21) having therein a dielectric layer (24) overlain by a first semiconductor layer (27) of a first conductivity type, forming a buried layer (86) of a second, opposite, conductivity type in the first semiconductor layer (27), forming a second semiconductor layer (28) overlying the first semiconductor layer, forming the at least one centrally located (81) and the at least one peripherally located (83) LDMOS region substantially in or on the second semiconductor layer (28), and forming in the first and second semiconductor layers and extending to the dielectric layer (24), a deep trench isolation (DTI) region (60) laterally bounding the at least one peripherally located (83) LDMOS region and the buried layer (86). According to a further embodiment, the first (27) and second (28) semiconductor layers are formed epitaxially. According to a still further embodiment, the method comprises forming a first drain region (32) and first (452) and second (453) source regions in the at least one centrally located LDMOS region (81), wherein the first drain region (32) is laterally located between the first (452) and second (453) source regions. According to a yet further embodiment, the method further comprises forming another drain region (31) and another source region (451) in the at least one peripherally located (83) LDMOS region, the another drain region (31) being located laterally outboard of the another source region (451). According to a still yet further embodiment, forming the another drain region (31) and another source region (451) comprises forming the another drain region (31) laterally closer to the DTI region (86) than the another source region (451). According to a yet still further embodiment, forming another drain region (31) and another source region (451) in the at least one peripherally located (83) LDMOS region comprises, providing a first well region (401) of the same conductivity type as the another drain region (31) proximate the DTI region (86) and forming the another drain region (31) therein.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a multi-gate lateral-diffused-metal-oxide-semiconductor (LDMOS) device having a centrally located LDMOS region and a peripherally located LDMOS region, comprising: providing a semiconductor-on-insulator (SOI) structure comprising a dielectric layer overlain by a first semiconductor layer of a first conductivity type; forming a second semiconductor layer over the first semiconductor layer; forming the centrally located and the peripherally located LDMOS region substantially in or on the second semiconductor layer; forming a deep trench isolation (DTI) region in the first and second semiconductor layers, the DTI region extending to the dielectric layer and laterally bounding the peripherally located LDMOS region; forming a buried layer of a second, opposite conductivity type in the first semiconductor layer, the buried layer further laterally bounded by the DTI region; and wherein the buried layer is formed in the first semiconductor layer, and wherein the second semiconductor layer is epitaxially grown over the first semiconductor layer after the formation of the buried layer therein.

2. The method of claim 1 wherein the first and second semiconductor layers are formed epitaxially.

3. The method of claim 1 further comprising forming a first drain region and first and second source regions in the centrally located LDMOS region, the first drain region laterally located between the first and second source regions.

4. The method of claim 1 further comprising forming the centrally located and the peripherally located LDMOS regions to be separated along a vertical boundary, which extends into the multi-gate LDMOS device at a location laterally adjacent the first source region.

5. The method of claim 1 further comprising forming another drain region and another source region in the peripherally located LDMOS region, the another drain region located laterally outboard of the another source region.

6. The method of claim 5 wherein the another drain region is laterally closer to the DTI region than to the another source region.

7. The method of claim 5 wherein forming another drain region and another source region in the peripherally located LDMOS region comprises providing a first well region of the same conductivity type as the another drain region proximate the DTI region and forming the another drain region therein.

8. A method for forming a multi-gate lateral-diffused-metal-oxide-semiconductor (LDMOS) device, the method comprising: forming an asymmetric edge-proximate LDMOS region on or over a semiconductor-on-insulator (SOI) support structure; forming a first source region of a first conductivity type in the asymmetric edge-proximate LDMOS region; and further forming a substantially symmetrical internal LDMOS region on or over which the SOI support structure, the substantially symmetrical internal LDMOS region and the asymmetric edge-proximate LDMOS region separated by a vertical boundary extending into the multi-gate LDMOS device at a location laterally adjacent the first source region; forming a deep trench isolation (DTI) wall extending into the support structure and terminating the edge-proximate LDMOS region; and forming a doped semiconductor (SC) buried layer (BL) region proximate the DTI wall, underlying a portion of the asymmetric edge-proximate LDMOS region, and of opposite conductivity type than the first drain region of the asymmetric edge-proximate LDMOS region.

9. The method of claim 8 wherein the SOI support structure comprises an insulating layer and a first semiconductor (SC) layer overlying the insulating layer, and wherein the method further comprises forming a second SC layer over the first SC layer.

10. The method of claim 9 wherein the substantially symmetrical internal LDMOS region and the asymmetric edge-proximate LDMOS region are formed substantially in the second SC layer.

11. A method for forming an a multi-gate lateral-diffused-metal-oxide-semiconductor (LDMOS) device, the method comprising: forming a first LDMOS region having a first source region and a first drain region about which the first LDMOS region is substantially symmetrical; forming a deep trench isolation (DTI) wall adjacent a sidewall edge of the LDMOS device; and forming a second LDMOS region having a second source region and a second drain region about which the second LDMOS region is asymmetrical, the second LDMOS region located between the first LDMOS region and the DTI wall, the first and second LDMOS regions separated by a vertical boundary extending into the multi-gate LDMOS device at a location laterally adjacent the second source region of the second LDMOS device; and forming a doped semiconductor (SC) buried layer (BL) region underlying the second LDMOS region and located proximate a juncture between the second LDMOS region and the DTI wall, the doped SC having a conductivity type opposite that of the second drain region.

12. The method of claim 11 further comprising
forming the first and second LDMOS regions on or over a semiconductor-on-insulator (SOI) support structure comprising a buried oxide layer; and
forming the doped SC BL region between the buried oxide layer and the second LDMOS region.

13. The method of claim 12 wherein the SOI support structure further comprises an SC layer overlying the buried oxide layer, and wherein the method further comprises forming the doped SC BL region in the SC layer.

14. The method of claim 13 further comprising forming the doped SC BL region to extend through the SC layer to the buried oxide layer.

15. The method of claim 11 further comprising forming the DTI wall to intersect the doped SC BL region.

* * * * *